United States Patent [19]
Gili

[11] 3,867,706

[45] Feb. 18, 1975

[54] FREQUENCY CONTROL AND STABILIZATION MEANS AND FREQUENCY DISCRIMINATOR

[75] Inventor: Paul E. Gili, Brookline, N.H.

[73] Assignee: Frequency Sources, Inc., North Chelmsford, Mass.

[22] Filed: Nov. 8, 1973

[21] Appl. No.: 413,916

[52] U.S. Cl. .................. 329/112, 328/141, 329/122, 331/12

[51] Int. Cl. .................. H03b 3/04, H03d 3/00

[58] Field of Search .......... 329/122, 50; 331/14, 12, 331/18, 23, 25; 325/419, 346; 328/140, 141

[56] References Cited

UNITED STATES PATENTS

| | | | |
|---|---|---|---|
| 3,525,945 | 8/1970 | Puente | 325/419 X |
| 3,530,399 | 9/1970 | Goggins | 331/25 X |
| 3,746,997 | 7/1973 | Willett et al. | 329/122 X |

*Primary Examiner*—Alfred L. Brody
*Attorney, Agent, or Firm*—Abraham Ogman

[57] ABSTRACT

The invention is directed to a circuit for controlling and stabilizing the frequency of oscillators. In both applications, this invention makes use of comparison signals derived from a frequency selective passive circuit and a second circuit providing a comparison signal which is a function of input power. The invention is particularly useful with voltage tunable oscillators.

10 Claims, 6 Drawing Figures

FREQUENCY CONTROL AND STABILIZATION MEANS AND FREQUENCY DISCRIMINATOR

Figure 1:
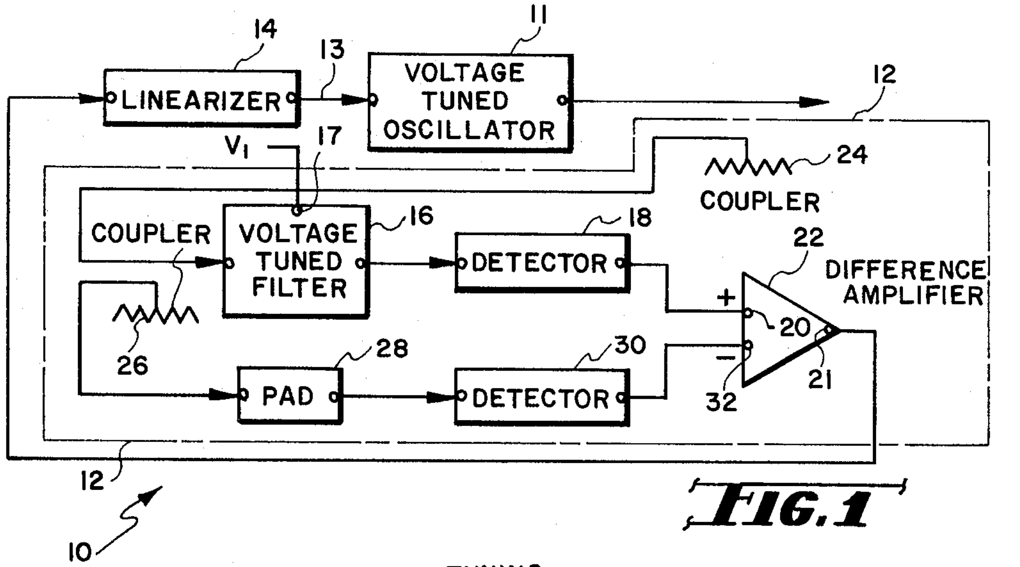

For years there has existed the problem of frequency stability of microwave oscillators. At microwave frequencies the elements that determine a resonant structure are generally so small that minute changes in their values can have large effects on resonant frequency. This results in large oscillator frequency drifts due to temperature changes and aging of components. The problem is most severe in the case of microwave oscillators which are voltage tunable over a wide frequency range. This is due to the fact that the resonant frequency determining structure for these oscillators is necessarily low-Q (lossy) due to the tight coupling required between active device (transferred electron diode or transistor) and voltage tunable structure. Recently, there has arisen a need for wide band voltage controlled oscillators (VCO's) which, when supplied by a suitable drive pulse of very constant voltage, settle to a precise frequency in a short period of time and stay at that frequency. For example, an oscillator may be required to have a voltage-tunable output frequency of from 4000 to 6000 MHz. When the tuning voltage is pulsed from a voltage corresponding to 4100 MHz to a voltage corresponding to 5000 MHz, the requirement may be that frequency drift from 1 $\mu$s to 500 ms after switching frequency be less than 1.0 MHz. Another requirement is often that frequency drift of such an oscillator over a long period of time, say 10 minutes after switching, be extremely small. Requirements of less than 500 KHz of drift during this interval are not uncommon.

The major source of these small frequency drifts is temperature changes of the active devices (transistors, varactor diodes, etc.) caused by small differences in their dissipation at two different frequencies. Other causes of frequency drift are not so well understood and include static charge buildup and storage of the charge within the tuning element. Small changes in amplitude of oscillation can have an effect on the oscillation frequency if the tuning diode is driven into forward conduction over part of the R.F. cycle so that the impedance of the diode is determined more by diffusion capacitance rather than depletion region capacitance.

Typical drifts of microwave sources pulsed in frequency over their tunable bands range from 10 to 50 MHz from 2.0$\mu$s after switching to 200 ms after switching. The solution presented below is theoretically capable of a factor of 1000 or so reduction in these numbers.

Improvements in oscillator performance in the past have centered on trying to maintain constant device characteristics over all values of output frequency. Circuits have been devised to maintain constant D.C. input power to transferred electron diodes and to transistors, in hopes of maintaining constant device temperature. Low-power transistor oscillators followed by amplifiers and frequency multipliers seem to work the best; however, they tend to be narrow band, complex and difficult to align. Frequency drift due to temperature changes can be reduced by using a proportional control heater. However, since the active devices under consideration are typically low in efficiency, they dissipate a lot of power themselves and sometimes require large amounts of heater power when heat sunk properly.

It is an object of the invention to provide an oscillator control means and a frequency discriminator which avoids the limitations and disadvantages of prior art devices.

It is another object of the invention to provide a control system for a variable frequency oscillator.

It is yet another object of the invention to provide a high speed voltage tunable frequency discriminator circuit.

The objects are to provide an oscillator control and/or frequency discriminator which:

1. provides a very high degree of frequency stability i.e., avoids frequency drifts due to aging, temperature changes, static discharge, etc.;
2. when changing frequency, causes the oscillator to settle to a precise selected frequency in a very short time and maintains the oscillator at the selected frequency for very long periods of time;
3. utilizes an inherently stable and precise circuit as the primary means;
4. avoids the use of devices exhibiting differences in power dissipation at different frequencies;
5. utilizes a tunable low pass filter as the primary control circuit;
6. utilizes a floating reference voltage to stabilize the tuning calibration; and
7. utilizes input circuit means in the discriminator that respond in a like manner to variations of power of the incoming signals.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

FIG. 1 is a block representation of the control system embodying the principals of the invention; and FIGS. 2 through 6 are curves that are useful in describing the operation of the FIG. 1 control system.

Referring to FIG. 1 of the drawings, there is represented a system 10 for controlling the frequency of voltage tuned oscillators. The system will operate equally well with any signal supply means that is capable of being varied and controlled by means of voltage.

The control system 10 comprises an oscillator 11 which, for the purpose of this discussion, is a widely used voltage tuned oscillator, and a tunable frequency discriminator formed from the circuits embodied within the dash-dot outline 12. The input of the oscillator 11 is coupled via line 13 to the output of a linearizer 14 which functions to improve the linearity between signals entering the linearizer 14 and the signals coupled to the oscillator 11.

The frequency discriminator 12 includes a voltage tuned filter 16 that is coupled through a detector 18 to one input 20 of a high gain difference amplifier 22. The filter 16 is coupled through a coupler 24, such as a conventional quarter wave directional coupler to the output of the oscillator 11. Preferably, the filter 16 is a low pass filter, though it will be shown that a band pass filter may be used.

The low pass filter 16 has a tunable cutoff frequency corresponding to the tuning range of the oscillator 11. A three section filter derived from an elliptic function filter prototype, using internal varactor diode parasitic inductances as part of the resonant circuit, was constructed and used in one system described hereinafter. The low pass filter 16 includes an input terminal 17 through which a control signal for selecting and controlling the oscillator 11 frequency is supplied.

The coupler 24 is a conventional quarter wave directional coupler.

In FIG. 1, an attenuator pad 28 is coupled to the output of the oscillator 11 through the coupler 26. In the alternative, the coupler 26 may be coupled directly to the oscillator 11.

The pad 28 is a passive constant attenuation attenuator network. The pad 28 is coupled through a detector 30 to the second input terminal 32 of the difference amplifier 22. The output of the amplifier 32 is coupled to the linearizer 14.

The system 10 is, by choice, a type "o" control loop as described in Chapter 6 of "Feedback Control System Analysis and Synthesis," D'Azzo, J. and Houpis, C., McGraw-Hill Book Co., New York, 1966. Its operation can be understood by first considering the outputs 40 of the detector 18 and 42 of detector 30, both in FIG. 2. It is reasonable to assume that the output voltages of these detectors are proportional to the power outputs from the low pass filter 16 and the pad 28.

These two functions are applied to the positive terminal 20 and the negative terminal 32 of the difference amplifier 22. The difference amplifier has an extremely high gain, in the order of 10,000, for example. It, in fact, is driven into saturation by very minute differential input voltages and there emerges from the output terminal 21 of the difference amplifier a voltage-frequency characteristic curve 44 depicted in FIG. 3.

Figure 2:
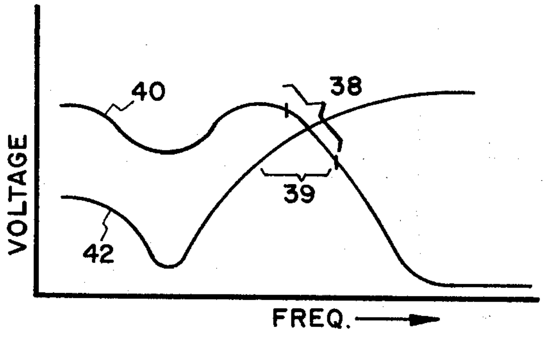
Figure 3:
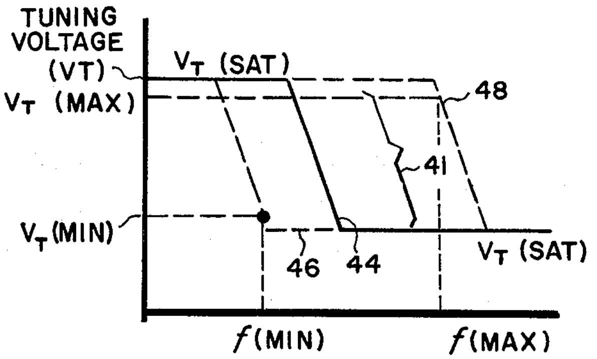
Figure 4:
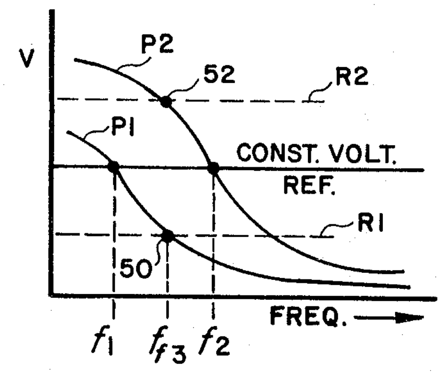

Portion 41 of curve 44 in FIG. 3, therefore, occurs at the frequency for which the outputs of detectors 18 and 30 in FIG. 1 are approximately equal, corresponding to the difference of portions 38 and 39 of curves shown in FIG. 2. The horizontal portions of curve 44 correspond to frequencies for which a large enough differential input voltage exists to drive the amplifier into saturation.

The control voltage $V_1$, applied to the input terminal 17 of the low pass filter 16, shifts the vertical portion 41 of the curve 44 to the left or right. In FIG. 3, the desired tuning range is depicted by curves 46 and 48.

It will be immediately clear to a person skilled in the art that the trailing edge of band pass filter may be used to provide a characteristic response similar to that of the low pass filter. Preferably, the leading edge of the band pass filter is adjusted to be outside of the frequency range of interest.

As was previously stated, a most important consideration is the avoidance of the use of constant reference voltage and substituting in its place a reference voltage which is proportional to the power output of the oscillator 11. The advantage gained by this substitution may be observed by examining FIG. 4. Curves $P_1$ and $P_2$ represent the detected voltage output of the low pass filter 16 at two different oscillator output levels. Changes in power level at the same frequency can be due to ageing, temperature variations, supply voltage changes, etc. Note that the constant voltage reference curve intersects $P_1$ and $P_2$ at two different frequencies, $f_1$ and $f_2$, respectively. It, therefore, follows that there will be a frequency shift for a shift in oscillator power.

The situation differs dramatically if the reference voltage follows the movement of the low pass filter output as the oscillator output power varies. Observe that the points 50 and 52 occur at the same frequency. The curves $R_1$ and $R_2$ represent the reference voltages-- in reality, the output voltages from pad 28 at power output levels from oscillator 11 that correspond to the levels from which curves $P_1$ and $P_2$ were derived.

Figure 5:
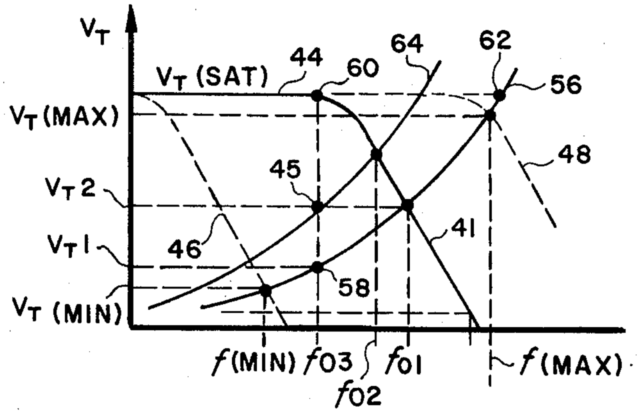
Figure 6:
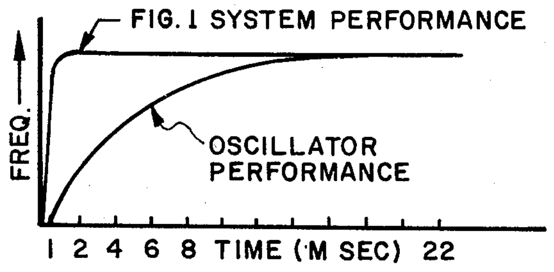

The operation of the control system 10 is best explained in connection with FIG. 5. The assumption is made that the oscillator 11 starts at frequency $f_{03}$. This is depicted at point 58 on a tuning curve 56 of the oscillator 11. the corresponding tuning voltage is $V_{T1}$.

The oscillator 11 is to be tuned to frequency $f_{01}$. A control voltage, $V_1$, the magnitude of which was obtained through a prior calibration, is applied to the input terminal 17 of the low pass filter 16. The curve 44 is shifted to the position indicated by the application of $V_1$. It will be noted that vertical portion 41 of the curve 44 intersects the oscillator 11 tuning curve 56 at frequency $f_{01}$.

With the oscillator 11 at frequency $f_{03}$ the tuning voltage $V_T$ at the output terminal of the amplifier 22 has a magnitude corresponding to the saturation voltage. See point 60. With $V_{T(sat)}$ applied to it, the oscillator 11 now wants to increase its frequency to correspond to point 62 on the tuning curve 56. As the oscillator frequency shifts to the right, $V_T$ follows curve 41 and decreases in magnitude. Although $V_T$ decreases, the oscillator frequency still increases along curve 56 from point 58. The tuning operation comes to a halt at the frequency $f_{01}$ where the vertical portion 41 of curve 44 intersects with the tuning curve 56. At this point of intersection, the discriminator output voltage $V_T$ equals the tuning voltage $V_{T2}$ required to tune the oscillator 11 to the frequency $f_{01}$.

It follows that the minimum frequency in the tuning range, $f_{(min)}$, occurs where curve 46 intersects the tuning curve 56. The maximum frequency, $f_{(max)}$, in the range occurs when curve 48 and the tuning curve 56 cross. Between these limits, the tuning voltage, $V_T$, varies between $V_{T(min)}$ and $V_{T(max)}$. A study of FIGS. 3 and 5 will instantly show that only the vertical portion 41 of the curve 44 plays an active role in the tuning operation.

The frequency stability function of the control system can be demonstrated as follows with the aid of curve 64. Let us assume that, for some reason or other, the tuning curve for the oscillator suddenly shifts from curve 56 to curve 64 while the desired frequency is $f_{01}$. The oscillator frequency shifts immediately to $f_{03}$ or point 45 as the tuning voltage $V_T$ remains briefly at $V_{T2}$. As this does not represent a stable condition, the discriminator responds to produce $V_{T(sat)}$ at point 60.

The sequence of events previously described takes place except that the tuning operation comes to a halt when the curves 41 and 64 cross, at $f_{02}$. The slope of the vertical portion 41 of the curve 44 is, actually, very steep due to the high gain of the amplifier 22. As a practical matter, the difference between $f_{02}$ and $f_{01}$ is very small, and can be adjusted to be within acceptable limits.

In fact, it can be shown that the effect of internal parameter changes upon the output, when going from open-loop to closed-loop is reduced by a factor of $1/(1+G)$ where G is the open loop gain. An open loop gain of 5000 is practicably achievable, leading to the conclusion that frequency drifts of the type described can be reduced by this number.

Table 1 below sets out the performance derived from a typical experimental setup. The frequency drift is tabulated as a function of time in three instances when the tuning voltage $V_T$ was changed. The first set of data was obtained using a VCO alone with the tuning voltage applied to the VCO. The second set of data was obtained using a control system as shown in FIG. 1. The tuning voltage represents the voltage derived from the amplifier and applied, through the linearizer, to the VCO. The results are shown graphically in FIG. 6.

TABLE I

| $V_T$ (Volts) | | Frequency Deviation in MHz (relative to frequency at 20 ms) | | | | | |
|---|---|---|---|---|---|---|---|
| From | To | VCO ALONE | | | | | |
| | | 30µs | 100µs | 300µs | 1ms | 3ms | 20ms |
| 0 | 3 | 10+ | 7 | 6 | 4 | 1 | 0 |
| 1 | 3 | 7 | 5 | 3.5 | 2 | 1 | 0 |
| 0 | 2 | 10+ | 5 | | 2 | 1 | 0 |
| | | VCO IN FIGURE 1 LOOP | | | | | |
| 0 | 3 | 2 | 1.2 | 0.3 | 0 | 0 | 0 |
| 1 | 3 | 1.5 | 0.9 | 0.2 | 0 | 0 | 0 |
| 0 | 2 | 3.5 | 2.5 | 1.2 | 0 | 0 | 0 |

As was seen, particularly with reference to the operation of the control circuit, the frequency determining factors no longer reside in the oscillator circuit. Instead of relying on the oscillator circuit components to govern the drift, settling time and frequency, the oscillator is, in this instance, locked on and controlled by a control means which is appreciably more stable and reliable. Tendencies to drift, or sluggishness with respect to settling down at a given frequency are overcome by the direct intervention of the control circuitry.

The combination of circuits in the dotted outline 12 comprise a high speed voltage tunable frequency discriminator. The control voltage $V_1$ sets the center frequency and the output voltage from the difference amplifier 22 which is representative of the input frequency. The frequency band of the discriminator is adjusted by adjusting the slope of the vertical portion 41 of the curve 44. As was previously explained, the slope of the vertical portion 41 of curve 44, and therefore the band of frequencies it represents, is a function of the gain of the difference amplifier 22, and the filter cutoff parameters.

In summary, the improvement in frequency stability results in an across-the-board improvement in performance in the following areas:

1. Frequency drift due to environmental temperature. (reduced essentially to drift of low-pass filter, which is easily controllable).
2. Frequency drift due to ageing.
3. Frequency pulling effects due to mismatch.
4. Frequency pushing effects due to supply voltage variations.
5. Frequency drift due to thermally induced active device parameter changes in the oscillator.
6. F.M. noise reduction within the closed-loop bandwidth of the system.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

I claim:

1. A frequency control and stabilization system comprising:

a. a tunable signal supply means for supplying a first signal at a frequency and at a power output level;

b. frequency filter means adjusted to said frequency and responsive to the frequency and power output level of said signal supply means for generating a first comparison signal having a magnitude that is a function of the frequency and power output level of said first signal;

c. means responsive to the power output level of said first signal for generating a second comparison signal having a magnitude which is a function of the said power output level; and d. circuit means for subtracting said comparison signals for developing a tuning signal, said tuning signal being coupled to said signal supply means for tuning said signal supply means to said frequency.

2. A frequency control and stabilization system as described in claim 1 wherein said signal supply means is tunable over a range of frequencies, said frequency filter means includes input means responsive to a control signal for tuning said frequency filter means to a predetermined frequency.

3. A frequency control and stabilization system as described in claim 2 wherein the signal supply means is tunable by means of a voltage adjustment and said tuning signal is a voltage having a magnitude which is a function of the frequency difference between the signal supply means and said frequency filter means.

4. A frequency control and stabilization system as described in claim 1 wherein the magnitude of said second comparison signal is proportional to power level of said first comparison signal.

5. A frequency control and stabilization system comprising:

a. a tunable signal supply means for providing an input signal having a frequency and a power output level;

b. a frequency filter circuit coupled to said signal supply means for providing a first comparison signal having a magnitude which is a function of the frequency and power output level of said input signal;

c. means responsive to said input signal to provide a second comparison signal having an amplitude which is a function of the power output level of said input signal; and d. means for subtracting the magnitudes of said first and second comparison signals, and amplifying said difference signal to provide a tuning signal for tuning said signal supply means.

6. A frequency control and stabilization system as described in claim 5 wherein the signal supply means is a voltage tuned variable frequency oscillator and said frequency filter means is a voltage tunable filter.

7. A frequency control and stabilizaton system as described in claim 6 wherein said filter is a low pass filter.

8. A frequency control and stabilization system comprising:

a. a tunable signal supply means for supplying a first signal at a frequency and a power output level;

b. a frequency filter circuit means for producing a first comparison signal having a first voltage-frequency response characteristic including a first portion wherein voltage decreases with increasing frequency and a magnitude proportional to said power output level;

c. circuit means for producing a second comparison signal having a second voltage-frequency characteristic including a second portion wherein voltage increases with increasing frequency, said first and second portions intersecting at a predetermined frequency, the magnitude of said second voltage-frequency characteristic also being proportional to the power output level of said first voltage-frequency characteristic; and d. means for subtracting the magnitude of said first and second comparison signals to form a tuning signal having a third voltage-frequency characteristic which includes a steep, near vertical, portion with said predetermined frequency at the midpoint, said tuning signal being coupled to said tunable signal supply means.

9. A frequency discriminator for producing a signal representative of the frequency of an applied input signal comprising:

a. a frequency filter circuit means forproducing a first comparision signal having a first voltage-frequency response characteristic including a firsst portion wherein voltage decreases with increasing frequency;

b. circuit means for producing a second comparison signal having a second voltage-frequency characteristic including a second portion wherein voltage increases with increasing frequency, said first and second portions intersecting at a predetermined frequency, said second voltage-frequency characteristic being proportional to the power of said first voltage-frequency characteristic; and c. means for subtracting the magnitude of said first and second voltage-frequency to form a third voltage-frequency characteristic which includes a steep, near vertical, portion with said predetermined frequency at the midpoint and which is representative of the frequency of said input signal.

10. A discriminator as described in claim 9 wherein said frequency filter circuit means is a tunable filter and said circuit means is a constant attenuation attenuator network.

* * * * *